(12) United States Patent
Seo

(10) Patent No.: US 6,799,590 B2
(45) Date of Patent: Oct. 5, 2004

(54) ERROR-PREVENTING DEVICE AND METHOD FOR SEMICONDUCTOR FABRICATION EQUIPMENT

(75) Inventor: Kwang-Hun Seo, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 400 days.

(21) Appl. No.: 09/995,295

(22) Filed: Nov. 27, 2001

(65) Prior Publication Data

US 2002/0104553 A1 Aug. 8, 2002

(30) Foreign Application Priority Data

Feb. 7, 2001 (KR) .......................................... 2001-5800

(51) Int. Cl.[7] .................................................. B08B 5/00
(52) U.S. Cl. ...................... 134/104.1; 134/113
(58) Field of Search ............................ 134/104.1, 113; 68/12.02

(56) References Cited

U.S. PATENT DOCUMENTS 4,696,712 A * 9/1987 Nonaka ...................... 156/351
5,529,638 A * 6/1996 Lutz .............................. 134/6
2002/0117188 A1 * 8/2002 Galburt et al. ................ 134/18

* cited by examiner

Primary Examiner—Frankie L. Stinson
Assistant Examiner—Joseph L. Perrin
(74) Attorney, Agent, or Firm—Marger Johnson & McCollom, P.C.

(57) ABSTRACT

A device for preventing errors during semiconductor wafer fabrication can be configured to prevent separation of optical sensor unit components, such as a gas supply pipe and a fixing guide, that could be caused by excess $N_2$ gas pressure. The device can also be configured to prevent excess moisture build-up that can lead to wafer sensing errors. The device includes a bath for receiving pure water or chemicals to remove particles. The bath can be further configured to discharge waste water after removal of the particles. Fixing guides are disposed at the outside of the bath to fix optical fiber sensors thereto. Optical fiber sensors are inserted into gas supply pipes, partially secured within the fixing guides. Purge output holes are formed at predetermined locations along the fixing guides to release $N_2$ gas pressure. A method for releasing excess pressure and a method for discharging excess moisture from an optical sensor unit are also provided.

6 Claims, 2 Drawing Sheets

ERROR-PREVENTING DEVICE AND METHOD FOR SEMICONDUCTOR FABRICATION EQUIPMENT

BACKGROUND OF THE INVENTION

1. Field of the Invention

The present invention relates to semiconductor fabrication equipment. More particularly, the invention relates to a device and method for preventing errors in a sensing operation during a wafer cleaning process.

2. Description of Related Art

A wet clean station supplies $N_2$ gas and pure water (DI) to wafers to remove wafer impurities such as polymer particles. Wafers are cleaned in a pure water bath (DI Water Bath) of the wet station. A quartz wet station (Quartz DI Water Bath) includes an optical fiber sensor attached to the outside of the pure water bath. The optical fiber sensor detects whether a wafer is present in the pure water bath.

FIG. 1 is a cross sectional view of a conventional wet clean station having optical fiber sensors 20a, 20b disposed on the outside of the pure water bath 10. Referring to FIG. 1, a conventional wet clean station includes a pure water bath 10. The pure water bath 10 receives a wafer. Pure water is supplied to the pure water bath 10 to clean the wafer. First and second fixing guides 12a, 12b are disposed at the upper and lower portions of the pure water bath 10, respectively, to fix an optical fiber sensor thereto. First and second gas supply pipes 14a, 14b are respectively inserted into the fixing guides 12a, 12b to supply nitrogen ($N_2$) gas to the inner side of the fixing guides 12a, 12b. First and second gas supply boxes 22a, 22b supply the $N_2$ gas through a gas inlet ($N_2$ Input) to a respective one of the first and second gas supply pipes 14a, 14b. The gas supply boxes 22a, 22b discharge the gas from the respective one of the first and second supply pipes 14a, 14b through a gas outlet ($N_2$ Output).

The first gas supply pipe 14a is provided with first and second O-rings 16a, 18a around its outer circumference. The second gas supply pipe 14b is provided with third and fourth O-rings 16b, 18b around its outer circumference. The first and second gas supply pipes 14a, 14b respectively include first and second optical fibers 20a, 20b. The first through fourth O-rings 16a, 18a, 16b, 18b serve to prevent pure water from flowing into the first and second fixing guides 12a, 12b from the outside. The first through fourth O-rings 16a, 18a, 16b, 18b also serve to prevent $N_2$ gas from being discharged from the first and second fixing guides 12a, 12b. The first and second O-rings 16a, 18a, and the third and fourth O-rings 16b, 18b further serve to secure the first and second gas supply pipes 14a, 14b into the first and second fixing guides 12a, 12b, respectively.

The pure water bath 10 of the wet station is supplied with pure water having a temperature of approximately 70° C. After cleaning the wafer, the waste water is then discharged, and a robot transfers the wafers from the pure water bath 10 to the next pure water bath. When the wafers are transferred to the next pure water bath of the wet station, the first and second optical fibers 20a, 20b detect whether a wafer is present in the pure water bath 10. During normal operation, the first fiber 20a emits light and the second fiber 20b receives the emitted light when no wafers are present.

Unfortunately, the temperature difference between the pure water (approximately 70° C.) and the outside room temperature (approximately 25° C.) results in dew forming on the outside surface of the pure water bath 10. Dew also forms inside the first and second fixing guides 12a, 12b. The presence of dew in the fixing guides 12a, 12b prevents the optical sensors 20a, 20b from transmitting and receiving light therethrough. This can result in errors in equipment operation because the system may operate as if wafers are present in the pure water bath 10 even when no wafers are present. If the first and second sensing fibers 20a, 20b experience errors in operation, the robot will stop transferring the wafers into the wet station, resulting in the wafers being dried in air. This causes inferior wafer quality.

To prevent operation error, $N_2$ gas is supplied to the first and second gas supply boxes 22a, 22b through the $N_2$ Inputs. Gas from the gas supply boxes 22a, 22b is supplied to the gas supply pipes 14a, 14b. Gas pressure (for example, 0.2 to 1 Kgf/m$^2$) builds up in the inner side of the first and second fixing guides 12a, 12b. Dew that is formed on the outside of the pure water bath 10 is discharged through the $N_2$ Output due to the pressure created by the $N_2$ gas. In this way, dew formed on the outside of the pure water bath 10 can be removed to prevent sensing errors.

Unfortunately, however, the gas pressure built up in the fixing guides 12a, 12b may cause the gas supply pipes 14a, 14b to become separated from the first and second fixing guides 12a, 12b. It would be desirable to have a device and method that prevented sensing errors. It would further be desirable to have a device and method that prevented unwanted pipe separation while preventing sensing errors.

SUMMARY OF THE INVENTION

Accordingly, an object of the present invention is to provide an error-preventing device that prevents errors in the operation of optical sensor units for semiconductor fabrication equipment.

Another object of the present invention is to provide a method for preventing errors in the operation of the optical fiber sensors of the fabrication equipment.

In order to achieve the foregoing objects, a wet clean station according to a preferred embodiment of the present invention includes a pure water bath for receiving pure water or chemicals to remove particles from a wafer. The pure water bath can be further configured to discharge waste water after removing the particles. Gas supply pipes are provided having optical fiber sensors inserted into the gas supply pipes. Fixing guides are disposed on the outside of the pure water bath to fix the optical fiber sensors thereto. Purge output holes are formed at predetermined locations along the fixing guides.

A method for preventing errors in the operation of fabrication equipment is also provided. The fabrication equipment preferably includes a cleaning station and an optical sensor unit. The cleaning station may be pure water bath. The optical sensor unit can include gas supply pipes, fixing guides, and optical sensors. The method includes discharging excess pressure and/or moisture from the optical sensor unit. This can be done, for instance, by forming purge output holes in the fixing guides to permit the expulsion of excess pressure and moisture therefrom.

BRIEF DESCRIPTION OF THE DRAWINGS

Preferred embodiments of the present invention will now be explained with reference to the accompanying drawings, in which.

DETAILED DESCRIPTION OF PREFERRED EMBODIMENTS

Figure 1:
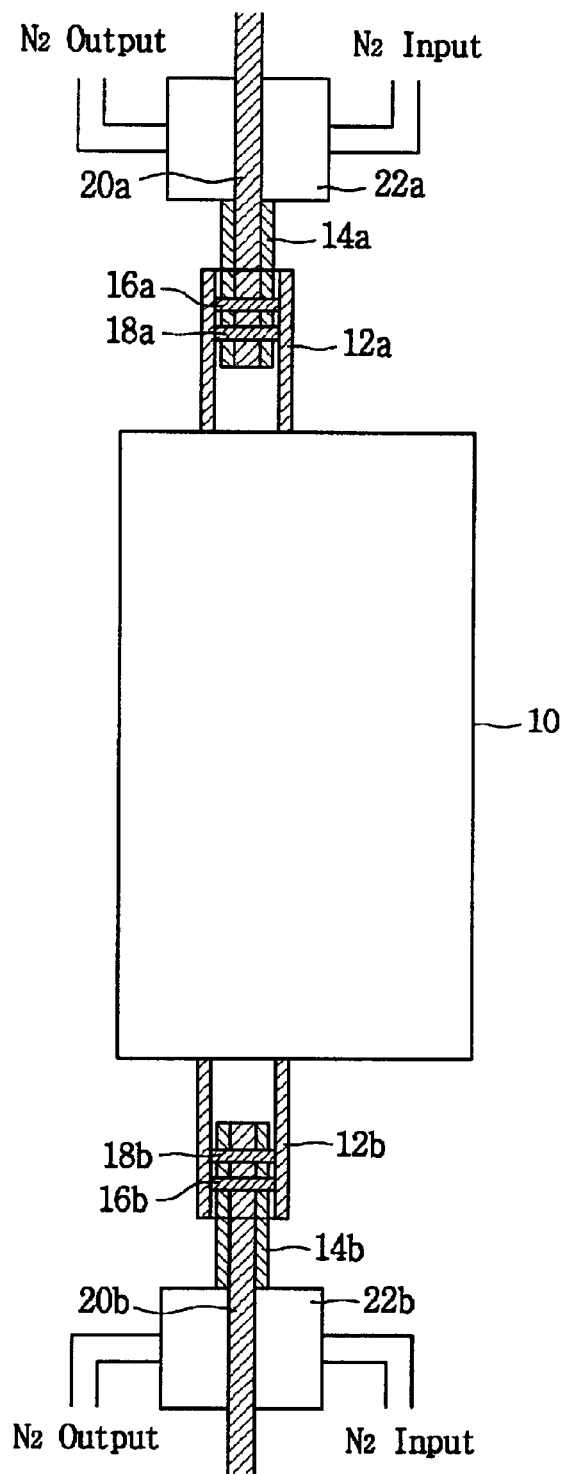
FIG. 1 is a cross sectional view of a conventional wet station pure water bath showing the position of optical fiber sensors.
Figure 2:
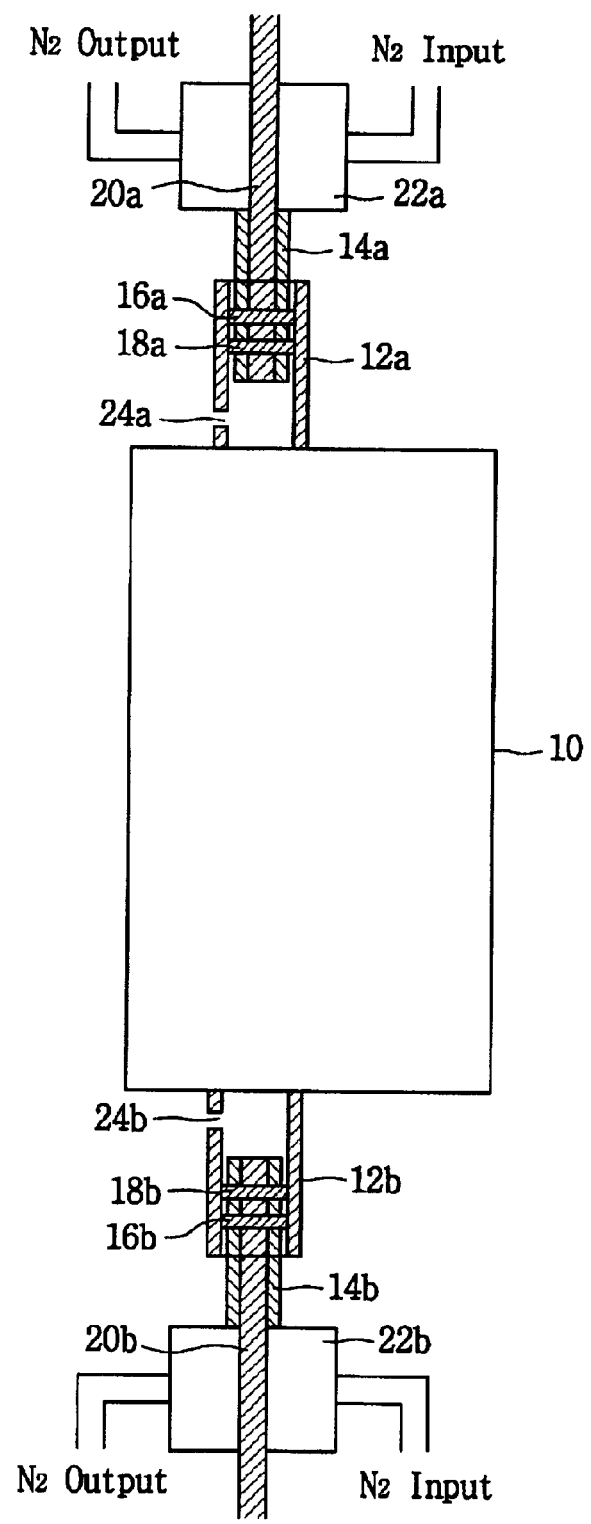
FIG. 2 is a cross sectional view of a wet station according to a preferred embodiment of the present invention, also showing the position of optical fiber sensors provided on the outside the pure water bath and further showing the location of purge holes provided in fixing guides to reduce sensing errors.

As noted above, FIG. 2 is a cross sectional view of a wet station pure water bath according to a preferred embodiment of the present invention. Referring to FIG. 2, a wet station according to this preferred embodiment includes a pure water bath 10 for loading and cleaning wafers. First and second fixing guides 12a, 12b are disposed at each of the upper and lower portions of the pure water bath 10, respectively to fix an optical fiber sensor thereto. First and second gas supply pipes 14a, 14b are inserted into the fixing guides 12a, 12b and are configured to supply $N_2$ gas to the inner side of the fixing guides 12a, 12b. Gas supply boxes 22a, 22b are provided to supply the $N_2$ gas to the first and second gas supply pipes 14a, 14b through gas inlets ($N_2$ Input) and to discharge the $N_2$ gas from the first and second supply pipes 14a, 14b through gas outlets ($N_2$ Output).

The first gas supply pipe 14a is provided with first and second O-rings 16a, 18a around the outer circumference thereof. The second gas supply pipe 14b is provided with third and fourth O-rings 16b, 18b around its outer circumference. The first and second gas supply pipes 14a, 14b are provided therein with first and second optical fibers 20a, 20b, respectively. The first through fourth O-rings 16a, 18a, 16b, 18b serve to prevent pure water from flowing into the first and second fixing guides 12a, 12b from the outside. The first through fourth O-rings 16a, 18a, 16b, 18b also prevent $N_2$ gas from being discharged from ends of the first and second fixing guides 12a, 12b. The first and second O-rings 16a, 18a and the third and fourth O-rings 16b, 18b, respectively, further aid in securing the first and second gas supply pipes 14a, 14b into a respective one of the first and second fixing guides 12a, 12b.

The fixing guides 12a, 12b according to this embodiment of the invention are further provided with purge output holes 24a, 24b at predetermined locations thereon. The purge holes 24a, 24b permit the discharge of dew formed therein. $N_2$ gas that is supplied through the first and second gas supply pipes 14a, 14b to the fixing guides 12a, 12b is released through the purge holes 24a, 24b, thereby expelling dew and preventing $N_2$ pressure build-up that could cause the first and second gas supply pipes 14a, 14b to separate from the first and second fixing guides 12a, 12b. The first and second gas supply pipes 14a, 14b, the gas supply boxes 22a, 22b, and first and second optical fibers 20a, 20b can be considered to collectively form an optical sensor unit.

The wet station pure water bath 10 is supplied with hot pure water having a temperature of approximately 70° C. to clean a wafer. After cleaning the wafer, the waste water is discharged, and a robot transfers the wafers from the pure water bath 10 to another pure water bath. When the wafers are transferred to the next pure water bath, the first and second optical fibers 20a, 20b detect whether a wafer is present in the pure water bath 10. The first and second optical fibers preferably have a light emitting part and a light receiving part. For example, the first fiber 20a can be configured to emit light and the second fiber 20b can be configured to receive light.

Since the pure water is at about 70° C. and the outside temperature is around 25° C., the temperature difference results in dew formation on the outside surface of the pure water bath 10 as well as in the first and second fixing guides 12a, 12b. The dew build-up prevents the first and second optical fibers 20a, 20b from transmitting and receiving light and can thereby result in a false detection of a wafer. This error in a sensing operation causes the unit to operate as if wafers are present in the pure water bath 10 of the wet station, even though no wafers are present therein.

According to the preferred embodiment of this invention, these sensing errors are prevented. Specifically, when $N_2$ gas is supplied to the first and second gas supply boxes 22a, 22b through the $N_2$ Inputs disposed above and below the pure water bath 10, gas pressure (for example, from between 0.2 to 1 Kgf/m$^2$) starts to build up in the inner side of the first and second fixing guides 12a, 12b. The $N_2$ gas pressure causes dew formed outside the pure water bath 10 in the fixing guides 12a, 12b to be discharged through the purge output holes 24a, 24b. Additionally, since the $N_2$ gas from the fixing guides 12a, 12b is discharged through the purge output holes 24a, 24b, excessive pressure build up is avoided and the first and second gas supply pipes 14a, 14b are prevented from being separated from the first and second fixing guides 12a, 12b. This further prevents errors in the operation of the optical sensor unit.

As described above, by forming purge holes 24a, 24b at predetermined locations on the fixing guides 12a, 12b, dew formed inside the fixing guides 12a, 12b can be discharged. Also, the fiber sensors 20a, 20b can be prevented from being separated from their normal positions. These results are obtained because the $N_2$ gas pressure that could otherwise cause separation is discharged through the purge output holes 24a, 24b, thus expelling excess pressure and moisture. Error in the operation of the fiber sensors 20a, 20b is thereby prevented. As a result, wafers can be dried normally and inferior wafer quality can be prevented.

What is claimed is:

1. A wet clean station, comprising:

a bath configured to remove particles from a wafer, said bath arranged to receive pure water or chemicals;

fixing guides disposed on an outside of the pure water bath to fix optical fiber sensors thereto;

gas supply pipes configured to receivingly engage the optical fiber sensors; and purge output holes formed at predetermined locations on the fixing guides.

2. A station according to claim 1, wherein said bath is further configured to discharge waste water after removing the particles from the wafer.

3. A station according to claim 1, wherein the fixing guides are disposed above and below the bath, respectively.

4. A station according to claim 1, wherein the fiber sensors are inserted into the fixing guides, one fiber sensor emits light, and the other fiber sensor receives light.

5. A station according to claim 1, wherein the purge output holes prevent the fiber sensors from being separated from the fixing guides when $N_2$ gas is supplied through the gas supply pipes.

6. A station according to claim 5, wherein the purge output holes discharge dew that is formed on the inner surface of the fixing guide using a pressure of the $N_2$ gas.

* * * * *